United States Patent
Lin et al.

(10) Patent No.: US 12,490,559 B2
(45) Date of Patent: Dec. 2, 2025

(54) PIXEL STRUCTURE WITH HIGH ASPECT RATIO CONDUCTIVE LINES FOR IMPROVED APERTURE RATIO

(71) Applicant: Industrial Technology Research Institute, Hsinchu (TW)

(72) Inventors: Yu-Chang Lin, Tainan (TW); Tai-Jui Wang, Kaohsiung (TW); Chieh Wei Feng, Taoyuan (TW); Wei-Chung Chen, Kaohsiung (TW)

(73) Assignee: Industrial Technology Research Institute, Hsinchu (TW)

( * ) Notice: Subject to any disclaimer, the term of this patent is extended or adjusted under 35 U.S.C. 154(b) by 693 days.

(21) Appl. No.: 17/566,478

(22) Filed: Dec. 30, 2021

(65) Prior Publication Data

US 2023/0216001 A1    Jul. 6, 2023

(51) Int. Cl.
*H10H 20/857*     (2025.01)
*H10H 20/832*     (2025.01)
*H10H 20/851*     (2025.01)
*H10K 59/123*     (2023.01)

(52) U.S. Cl.
CPC ........ *H10H 20/857* (2025.01); *H10H 20/835* (2025.01); *H10H 20/851* (2025.01); *H10K 59/123* (2023.02)

(58) Field of Classification Search
CPC ..... H01L 33/62; H10K 59/123; H10H 20/857
See application file for complete search history.

(56) References Cited

U.S. PATENT DOCUMENTS

| | | | |
|---|---|---|---|
| 6,522,011 B1 | 2/2003 | Farrar | |
| 7,619,901 B2 | 11/2009 | Eichelberger et al. | |
| 10,503,062 B2 | 12/2019 | Parker et al. | |
| 2007/0231974 A1 | 10/2007 | Chiu et al. | |
| 2014/0131666 A1 | 5/2014 | Song et al. | |
| 2018/0151633 A1* | 5/2018 | Won | H10K 59/1216 |
| 2019/0341306 A1* | 11/2019 | Yu | H01L 24/08 |
| 2021/0273195 A1* | 9/2021 | Lee | H10K 59/123 |
| 2022/0336557 A1* | 10/2022 | Lee | H10K 59/1216 |

FOREIGN PATENT DOCUMENTS

| | | |
|---|---|---|
| CN | 101118290 A | 2/2008 |
| CN | 100385660 C | 4/2008 |
| TW | 200818393 A | 4/2008 |
| TW | 200815932 A | 4/2012 |

* cited by examiner

*Primary Examiner* — Christine S. Kim
*Assistant Examiner* — Tyler J Wiegand

(57) ABSTRACT

A pixel structure is provided. The pixel structure includes a substrate and a conductive line electrically connected to the substrate. The ratio of the height to the width of the conductive line is between 0.5 and 6. The pixel structure also includes an electrode electrically connected to the conductive line and a conversion element electrically connected to the conductive lines through the electrode.

17 Claims, 20 Drawing Sheets

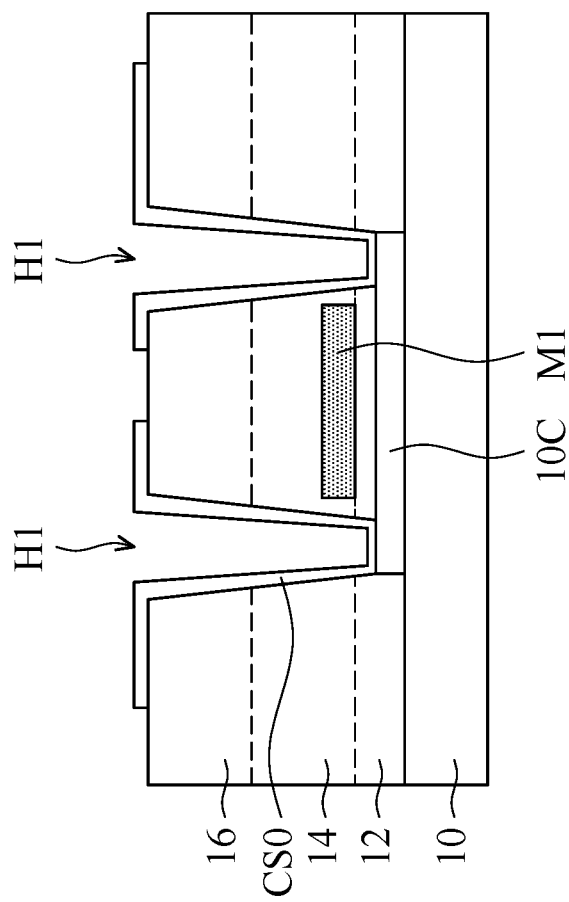

PIXEL STRUCTURE WITH HIGH ASPECT RATIO CONDUCTIVE LINES FOR IMPROVED APERTURE RATIO

TECHNICAL FIELD

The embodiment of the present disclosure relates to a pixel structure, and particularly to a pixel structure with high transparency and/or sensing properties.

BACKGROUND

With the development of touch screen and/or display technologies, the applications of electronic devices with (touch-enabled) display screens have become wider and more diverse. For example, transparent display panels may be used for virtual and reality integration in smart display applications, such as interactive display devices (e.g., artwork display windows and interactive sensing glass for vehicles).

However, existing product designs and current manufacturing techniques are limiting, and it is not easy to reduce the width of the conductive line or the size of the via hole in the display panel, and it is difficult to manufacture a display panel with high transparency and/or an integrated sensing structure. Insufficient transparency may reduce the clarity of the background items, affecting the contrast between the background and the image of the interactive display device, and this may affect the user's viewing quality, impact the convenience and smoothness of operation, and limit the uses of the display panel.

SUMMARY

The embodiment of the present disclosure includes a pixel structure. The pixel structure includes a substrate and a conductive line electrically connected to the substrate. The ratio of the height to the width of the conductive line is between 0.5 and 6. The pixel structure also includes an electrode electrically connected to the conductive line and a conversion element electrically connected to the conductive lines through the electrode.

BRIEF DESCRIPTION OF DRAWINGS

Aspects of the embodiments of the present disclosure can be understood from the following detailed description when read with the accompanying figures. It should be noted that various features are not drawn to scale and are for illustration purposes. In fact, the dimensions of the various elements may be arbitrarily increased or reduced to clearly represent the technical features of the embodiments of the present disclosure.

FIGS. 3A-3C are cross-sectional views illustrating steps of forming the conductive line and electrically connecting the conductive line to the substrate according to some embodiments of the present disclosure.

DETAILED DESCRIPTION

Figure 1:
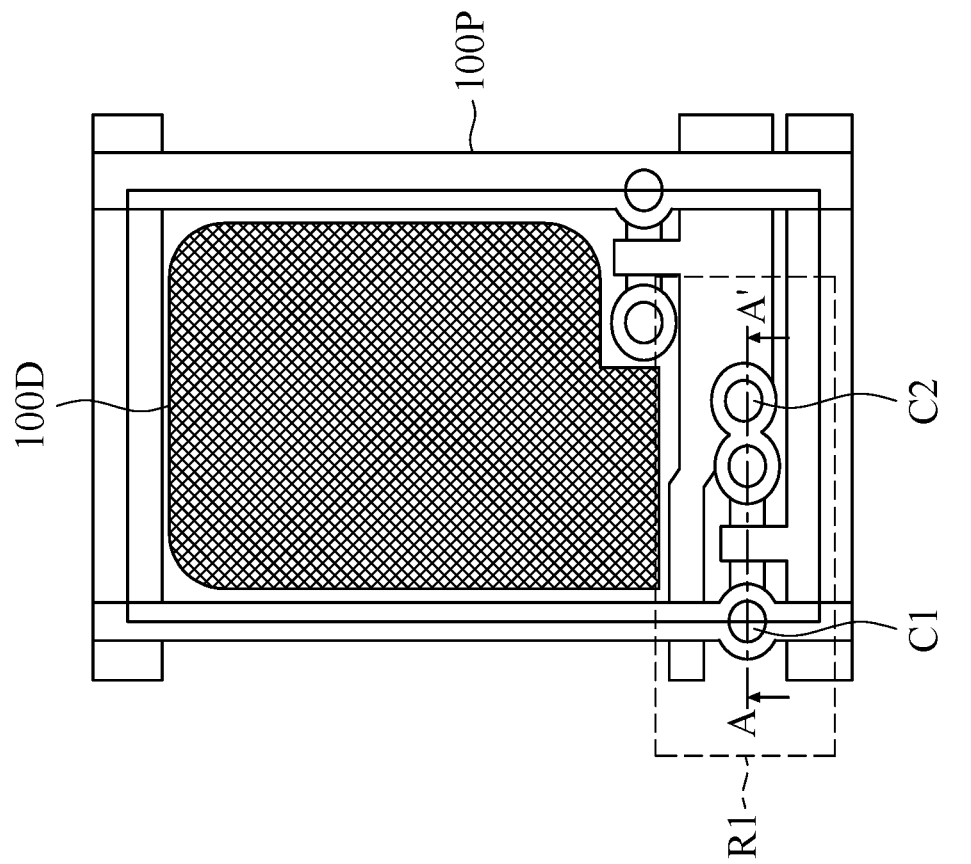
FIG. 1 is a partial top view illustrating the pixel structure according to some embodiments of the present disclosure.

The following disclosure provides many different embodiments, or examples, for implementing different features of the subject matter provided. Specific examples of components and arrangements are described below to simplify the present disclosure. These are, of course, merely examples and are not intended to be limiting. For example, a first feature is formed on a second feature in the description that follows may include embodiments in which the first feature and second feature are formed in direct contact, and may also include embodiments in which additional features may be formed between the first feature and second feature, so that the first feature and second feature may not be in direct contact.

It should be understood that additional steps may be implemented before, during, or after the illustrated methods, and some steps might be replaced or omitted in other embodiments of the illustrated methods.

Furthermore, spatially relative terms, such as "beneath," "below," "lower," "on," "above," "upper" and the like, may be used herein for ease of description to describe one element or feature's relationship to other elements or features as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In the present disclosure, the terms "about," "approximately" and "substantially" typically mean+/−20% of the stated value, more typically +/−10% of the stated value, more typically +/−5% of the stated value, more typically +/−3% of the stated value, more typically +/−2% of the stated value, more typically +/−1% of the stated value and even more typically +/−0.5% of the stated value. The stated value of the present disclosure is an approximate value. That is, when there is no specific description of the terms "about,"

"approximately" and "substantially", the stated value includes the meaning of "about," "approximately" or "substantially".

Unless otherwise defined, all terms (including technical and scientific terms) used herein have the same meaning as commonly understood by one of ordinary skill in the art to which this disclosure belongs. It should be understood that terms such as those defined in commonly used dictionaries should be interpreted as having a meaning that is consistent with their meaning in the context of the relevant art and will not be interpreted in an idealized or overly formal sense unless expressly so defined in the embodiments of the present disclosure.

The present disclosure may repeat reference numerals and/or letters in following embodiments. This repetition is for the purpose of simplicity and clarity and does not in itself dictate a relationship between the various embodiments and/or configurations discussed.

"Aperture ratio" refers to the ratio of light transmittance, that is, the ratio that allows the light source to be projected and reduces the consumption of the light source on (in) the display panel. The higher the aperture ratio, the more light is transmitted. For example, in a liquid crystal display device, when lights are emitted from the backlight module, not all lights may pass through the liquid crystal display panel. They may be blocked by signal lines (e.g., driving chips, thin film transistors, etc.) and storage capacitors that store voltage. Generally speaking, the ratio of the effective light-transmitting area to the overall area of the display panel may be called the aperture ratio.

In the pixel structure of the display panel, the pixel aperture ratio is mainly affected by the size of the peripheral circuit and the size of the via hole of the circuit. In order to achieve finer display quality (e.g., higher pixels per inch (PPI) or pixel density), the pixel size of the pixel structure is getting smaller and smaller. However, this also makes the size of the peripheral circuit and the size of the via hole of the circuit have a more significant influence on the aperture ratio.

For example, under the condition that the width of the peripheral circuit (i.e., the line width) is 5 micrometers (μm) and the width of the via hole is 5 micrometers, the pixel aperture ratio only reaches 70%. In a transparent display panel, a lower aperture ratio will reduce the transparency of the display panel, thereby affecting the display quality of the transparent display panel.

In the embodiments of the present disclosure, the conductive lines of the pixel structure of the display panel have an aspect ratio (i.e., the ratio of height to width), for example, between about 0.5 and about 6. Moreover, in some embodiments, the included angle between the via hole and the plane parallel to the surface of the substrate in the pixel structure is between about 60 degrees and about 85 degrees in the corresponding region. Such a configuration may effectively improve the (pixel) aperture ratio of the pixel structure, thereby improving the resolution of the display image, and manufacturing a display panel with high transparency and/or a sensing integrated structure.

Figure 2:
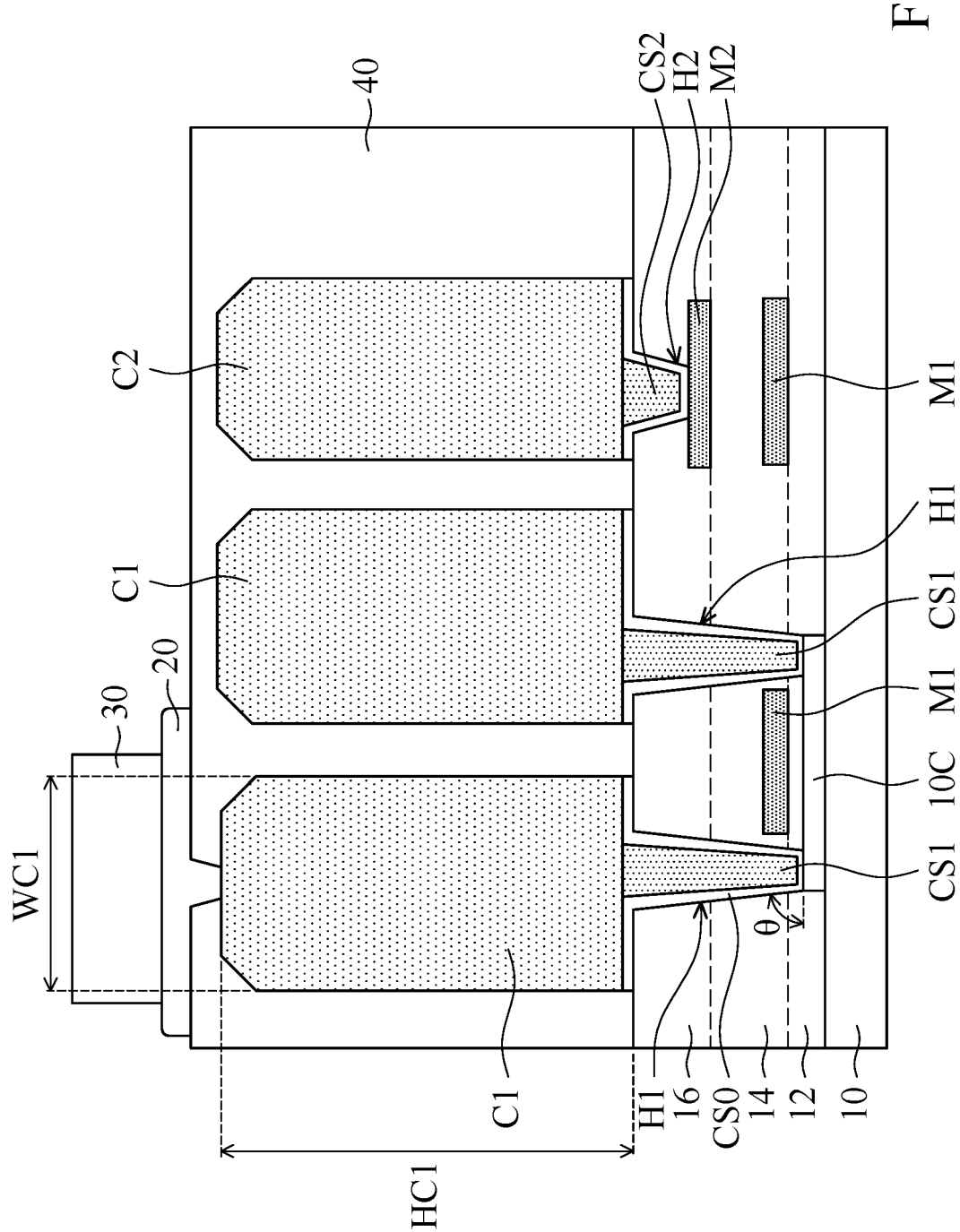
FIG. 2 is a partial cross-sectional view illustrating the region of the pixel structure in FIG. 1 according to some embodiments of the present disclosure.

FIG. 1 is a partial top view illustrating the pixel structure 100 according to some embodiments of the present disclosure. FIG. 2 is a partial cross-sectional view illustrating the region R1 of the pixel structure 100 in FIG. 1 according to some embodiments of the present disclosure. For example, FIG. 2 may be a partial cross-sectional view along line A-A' of FIG. 1. It should be noted that some components of the pixel structure 100 have been omitted in FIG. 1 and FIG. 2, and the components shown in FIG. 1 and FIG. 2 may not correspond exactly.

Referring to FIG. 1, in some embodiments, the pixel structure 100 has (or is divided into) a display region 100D and a peripheral region 100P that surrounds the display region 100D. For example, the display elements, the photoelectric conversion elements, the sensing contact devices, etc. of the pixel structure 100 may be disposed in the display region 100D of the pixel structure 100, and the operating elements, the sensing elements, the display elements, the conductive lines, the conductive pads, etc. of the pixel structure 100 may be disposed in the peripheral region 100P of the pixel structure 100, but the present disclosure is not limited thereto.

Referring to FIG. 1 and FIG. 2, in some embodiments, the pixel structure 100 includes a substrate 10. The substrate 10 may be a rigid circuit substrate, which may include elemental semiconductors (e.g., silicon or germanium, etc.), compound semiconductors (e.g., silicon carbide (SiC), gallium arsenide (GaAs), indium arsenide (InAs), or indium phosphide (InP), etc.), alloy semiconductors (e.g., SiGe, SiGeC, GaAsP, or GaInP, etc.), other suitable semiconductors, or a combination thereof. The substrate 10 may also be a flexible circuit substrate, a semiconductor-on-insulator (SOI) substrate, a glass substrate, or the like. Moreover, the substrate 10 may also serve as a gas barrier layer.

Referring to FIG. 1 and FIG. 2, in some embodiments, the pixel structure 100 includes conductive lines C1 and C2. The conductive lines C1 and C2 are, for example, disposed in the peripheral region 100P of the pixel structure 100. As shown in FIG. 2, in some embodiments, the conductive line C1 is electrically connected to the substrate 10 through the via hole H1 and the conductive layer CS1 filled in the via hole H1. Specifically, the conductive layer CS1 may be connected to the semiconductor layer 10C of the substrate 10, but the present disclosure is not limited thereto.

The conductive lines C1, C2 and the conductive layer CS1 may include conductive materials, such as a metal, a metal silicide, similar materials, or a combination thereof. For example, the metal may include gold (Au), nickel (Ni), platinum (Pt), palladium (Pd), iridium (Ir), titanium (Ti), chromium (Cr), tungsten (W), aluminum (Al), copper (Cu), similar materials, the alloy thereof, or a combination thereof, but the present disclosure is not limited thereto. In addition, the semiconductor layer 10C may include a semiconductor material, such as polysilicon.

As shown in FIG. 2, in some embodiments, the ratio of the height HC1 to the width WC1 of the conductive line C1 (i.e., HC1/WC1) is between about 0.5 and about 6. Moreover, in this embodiment, the width WC1 of the conductive line C1 (i.e., the line width) is 2 micrometers (μm) as an example. In some other embodiments, the ratio of the height HC1 to the width WC1 of the conductive line C1 is between about 2 and about 5. The ratio of the height HC1 to the width WC1 of the conductive line C1 may be adjusted to an appropriate range according to the width WC1 of the conductive line C1.

As shown in FIG. 2, in some embodiments, the pixel structure 100 may further include a first interlayer dielectric layer 12, a second interlayer dielectric layer 14, and a third interlayer dielectric layer 14 disposed between the substrate 10 and the conductive lines C1, C2. The first interlayer dielectric layer 12 may include, for example, silicon oxides, silicon nitrides, similar materials, or combinations thereof, and the second interlayer dielectric layer 14 and the third interlayer dielectric layer 16 may include, for example, silicon oxide, silicon nitride, silicon oxynitride, low-K dielectric materials, aluminum oxide, aluminum nitride, similar materials, or combinations thereof, but the present disclosure is not limited thereto. The first interlayer dielectric layer 12 may serve as a gate insulating layer. Moreover, the via hole H1 may penetrate the third interlayer dielectric layer 16, the second interlayer dielectric layer 14, and the first interlayer dielectric layer 12.

As shown in FIG. 2, in some embodiments, the included angle θ between the via hole H1 and a plane parallel to the surface of the substrate (e.g., the top surface of the semiconductor layer 10C of the substrate 10) is between about 60 degrees and about 85 degrees. By forming the conductive line C1 to have an aspect ratio (i.e., the ratio of height to width), such as between about 0.5 to about 6, and/or the included angle θ between the via hole H1 and the plane parallel to the surface of the substrate 10 is between about 60 degrees to about 85 degrees, which may effectively improve the (pixel) aperture ratio of the pixel structure 100.

Figure 3B:
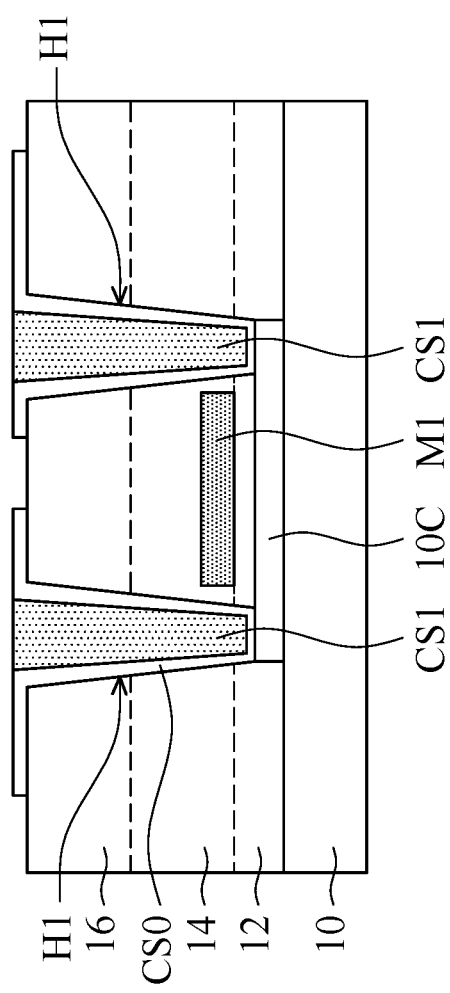
Figure 3C:
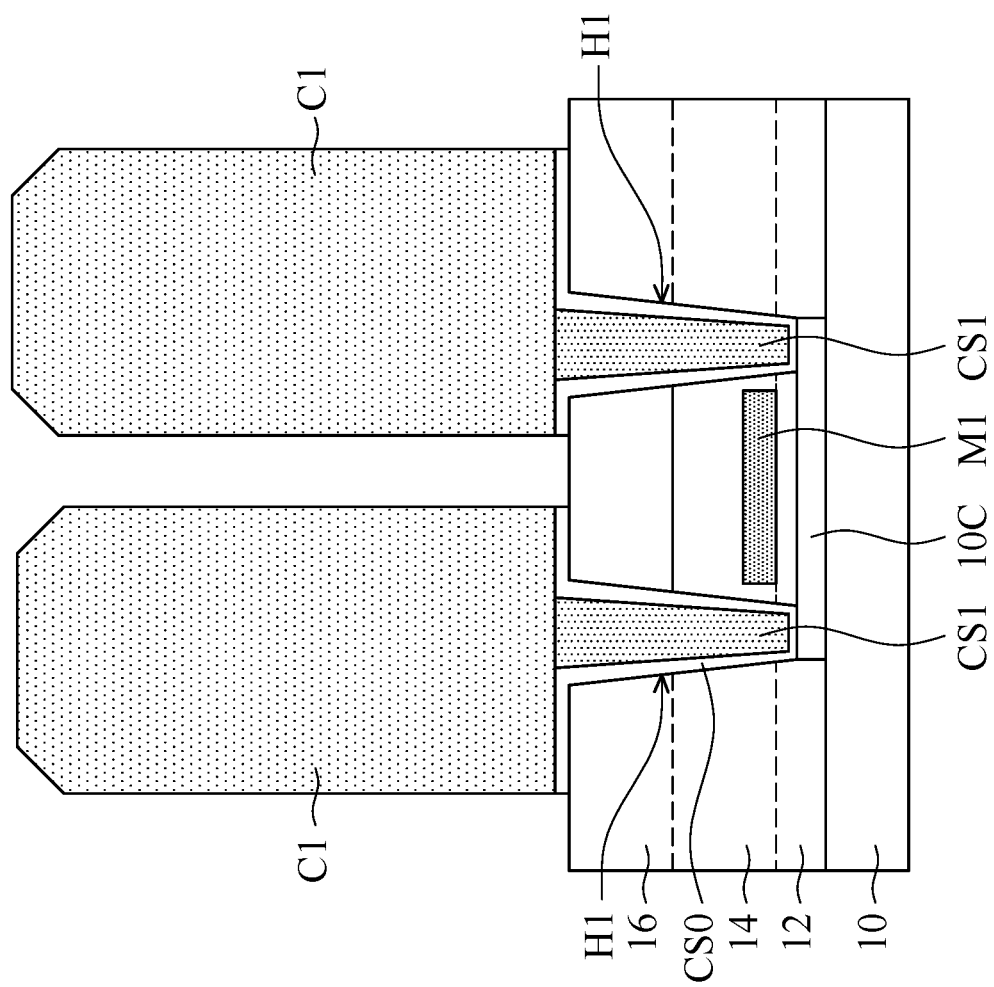

FIGS. 3A-3C are cross-sectional views illustrating steps of forming the conductive line C1 and electrically connecting the conductive line C1 to the substrate 10 according to some embodiments of the present disclosure. Referring to FIG. 3A, first, a first interlayer dielectric layer 12, a second interlayer dielectric layer 14, and a third interlayer dielectric layer 16 are formed on the substrate 10. For example, the first interlayer dielectric layer 12, the second interlayer dielectric layer 14, and the third interlayer dielectric layer 16 may be formed on the substrate 10 by a deposition process. The deposition process includes, for example, a chemical vapor deposition process, an atomic layer deposition process, a spin-on coating process, a similar deposition process, or a combination thereof, but the present disclosure is not limited thereto. In addition, although the first interlayer dielectric layer 12, the second interlayer dielectric layer 14, and the third interlayer dielectric layer 16 are shown here as three different stacks, the first interlayer dielectric layer 12, the second interlayer dielectric layer 14, and the third interlayer dielectric layer 16 may also be the same layer. Alternatively, the second interlayer dielectric layer 14 and the third interlayer dielectric layer 16 may be regarded as the same interlayer dielectric layer.

As shown in FIG. 3A, a via hole H1 is then formed, and the via hole H1 may penetrate the third interlayer dielectric layer 16, the second interlayer dielectric layer 14, and the first interlayer dielectric layer 12. For example, a patterning process may be performed to form the via hole H1. The patterning process includes forming a mask layer (not shown) over the third interlayer dielectric layer 16, and then etching portions of the third interlayer dielectric layer 16, the second interlayer dielectric layer 14, and the first interlayer dielectric layer 12 not covered by the mask layer to form the via hole H1. It should be noted that although not clearly indicated in FIG. 3A, the included angle θ between the via hole H1 and a plane parallel to the surface of the substrate 10 (e.g., the top surface of the semiconductor layer 10C of the substrate 10) may be between about 60 degrees and about 85 degrees, similar to that shown in FIG. 2.

For example, the mask layer may include photoresist, such as positive photoresist or negative photoresist. In addition, the mask layer may include a hard mask, such as silicon oxide ($SiO_2$), silicon nitride ($SiN_x$), silicon oxynitride (SiON), silicon carbide (SiC), silicon carbide nitride (SiCN), similar materials, or a combination thereof. The mask layer may be a single-layer or a multi-layer structure. The formation of the mask layer may include a deposition process, a photolithography process, any other suitable process, or a combination thereof, but the present disclosure is not limited thereto.

For example, the deposition process may include spin-on coating, chemical vapor deposition, atomic layer deposition, similar processes, or a combination thereof. For example, the photolithography process may include photoresist coating (e.g., spin-on coating), soft baking, mask aligning, exposure, post-exposure baking (PEB), developing, rinsing, drying (e.g., hard baking), other suitable processes, or a combination thereof.

As shown in FIG. 3A, a sputtering process may be then performed to form a conductive layer CS0 on the sidewall of the via hole H1. For example, the conductive layer CS0 includes conductive materials, the examples of which are described above and will not be repeated here. In some embodiments, the conductive layer CS0 may further cover a portion of the third interlayer dielectric layer 16.

Referring to FIG. 3B, the conductive layer CS1 may be filled in the via hole H1 by, for example, an electroplating process or an electroless plating process. As shown in FIG. 3B, the top surface of the conductive layer CS1 and the top surface of the conductive layer CS0 may be substantially aligned, but the present disclosure is not limited thereto.

Referring to FIG. 3C, another electroplating process or electroless plating process may be performed to form the conductive line C1 on the conductive layer CS1. It should be noted that, although not explicitly indicated in FIG. 3C, the ratio of the height HC1 to the width WC1 of the conductive line C1 (i.e., HC1/WC1) may be between about 0.5 and about 6, similar to that shown in FIG. 2.

In addition, although the conductive layer CS1 and the conductive line C1 are formed by two processes in the embodiment of FIG. 3B and FIG. 3C, the present disclosure is not limited thereto. In some other embodiments, the conductive layer CS1 and the conductive line C1 may be formed by the same process.

In the embodiments of FIGS. 3A-3C, the conductive layer CS0, the conductive layer CS1, and the conductive line C1 may be formed by a sputtering process (e.g., copper sputtering) and an electroplating/electroless plating process (e.g., electroplating/electroless copper) Therefore, the conductive material (e.g., metal) may fill the via hole H1, thereby reducing the signal loss of the via hole H1.

Referring back to FIG. 2, in some embodiments, the pixel structure 100 includes an electrode 20, and the electrode 20 may be disposed on the conductive line C1 and electrically connected to the conductive line C1. For example, electrode 20 may include metals (e.g., copper, molybdenum, aluminum, tungsten, gold, chromium, nickel, platinum, or titanium), alloys (e.g., alloys of the foregoing metals), transparent conductive materials, other suitable conductive materials, or combinations thereof, but the present disclosure is not limited thereto. Transparent conductive materials include, for example, indium tin oxide (ITO), tin oxide (TO), indium zinc oxide (IZO), indium gallium zinc oxide (IGZO), indium tin zinc oxide (ITZO), antimony-doped tin oxide (ATO), or aluminum-doped zinc oxide (AZO), but the present disclosure is not limited thereto.

Referring to FIG. 2, in some embodiments, the pixel structure 100 includes a conversion element 30 electrically connected to the conductive line C1 through the electrode 20. The conversion element 30 may be a photoelectric conversion element or any other conversion element. For example, the conversion element 30 may be a light-emitting element of the pixel structure 100, such as a light-emitting diode (LED), a micro/mini light-emitting diode (micro LED or mini-LED), a quantum dot light-emitting diode (QLED/QDLED), quantum dots, an organic light-emitting diode (OLED), or any other suitable component, but the present disclosure is not limited thereto. Alternatively, the conversion element 30 may also be a sensing element of the pixel structure 100 of the touch-sensitive display panel, such as a PIN-type photo sensor, a diode sensing element, or any other suitable component, but the present disclosure is not limited thereto.

Referring to FIG. 2, in some embodiments, the pixel structure 100 includes a planarization layer 40, and the planarization layer 40 may be disposed between the conductive line C1 and the conversion element 30. In more detail, the planarization layer 40 is disposed between the conductive line C1 and the electrode 20, between the conductive lines C1, and/or between the conductive line C1 and the conductive line C2. The planarization layer 40 may include polyimide (PI), spin-on glass (SOG), or any other suitable material, but the present disclosure is not limited thereto.

In the pixel structure 100 of the embodiment of the present disclosure, since the ratio of the height HC1 to the width WC1 of the conductive line C1 (i.e., HC1/WC1) is between about 0.5 and about 6, the design space and transparency of the pixel structure 100 may be increased, and the voltage degradation of the pixel structure 100 may be reduced. In addition, in some embodiments, the included angle θ between the via hole H1 and the plane parallel to the surface of the substrate 10 is between about 60 degrees and about 85 degrees, which may effectively improve the (pixel) aperture ratio of the pixel structure 100, thereby improving the resolution and transparency of the pixel structure 100 (and the display panel using the pixel structure 100).

The following is the measurement of the pixel aperture ratios of the pixel structures of the embodiments and the comparative example under the condition that the pixel design is 100 PPI. The conductive line of Embodiment 1 had a width (i.e., line width) of 2 μm, and the ratio of the height to the width of the conductive line was about 5; the conductive line of Embodiment 2 had a width (i.e., line width) of 2 μm, the ratio of the height to the width of the conductive line was about 6, and the included angle between the via hole and the plane parallel to the surface of the substrate was about 85 degrees (which was similar to the pixel structure 100 shown in FIG. 1 and FIG. 2); the conductive line of Comparative Example had a width (i.e., line width) of 5 μm, the ratio of the height to the width of the conductive line was about 0.1 (not in the range of 0.5 to 6), and the included angle between the via hole and the plane parallel to the surface of the substrate was about 50 degrees (not in the range of 60 degrees to 85 degrees) (which was similar to the pixel structure of a general display panel). The measurement results were recorded in Table 1 below.

TABLE 1

|  | (pixel) aperture ratio |
| --- | --- |
| Embodiment 1 | 78.6% |
| Embodiment 2 | 81.4% |
| Comparative Example | 70% |

It can be seen from the results in Table 1 that the pixel aperture ratios of the pixel structures of Embodiment 1 and Embodiment 2 are significantly improved compared to the pixel aperture ratio of the pixel structure of the Comparative Example. Therefore, the pixel structure according to the embodiment of the present disclosure may have a higher pixel aperture ratio, thereby improving the resolution and transparency of the pixel structure and a display panel using the pixel structure.

As shown in FIG. 2, in some embodiments, the pixel structure 100 includes a first conductor layer M1 disposed in the second interlayer dielectric layer 14 and between the substrate 10 and the conductive line C1 and/or the conductive line C2. The first conductor layer M1 may include a metal or a metal oxide, wherein the metal may be, for example, gold (Au), nickel (Ni), platinum (Pt), palladium (Pd), iridium (Ir), titanium (Ti), chromium (Cr), tungsten (W), aluminum (Al), copper (Cu), similar materials, alloys thereof, or a combination thereof, but the present disclosure is not limited thereto.

As shown in FIG. 2, in some embodiments, the pixel structure 100 includes a second conductor layer M2 disposed in the third interlayer dielectric layer 16 and between the first conductor layer M1 and the conductive line C2. The second conductor layer M2 includes the same or similar materials as the first conductor layer M1, which will not be repeated here, but the present disclosure is not limited thereto. The first conductor layer M1, the interlayer dielectric layer (e.g., the second interlayer dielectric layer 14), and the second conductor layer M2 may form a metal-insulator-metal (MIM) capacitor element.

As shown in FIG. 2, in some embodiments, the conductive line C2 is electrically connected to the second conductor layer M2. Similarly, the conductive line C2 may be electrically connected to the second conductor layer M2 through the via hole H2 and the conductive layer CS2 filled in the via hole H2. In addition, the included angle between the via hole H2 and a plane parallel to the surface of the substrate 10 (e.g., the top surface of the second conductor layer M2) may also be between about 60 degrees and about 85 degrees.

FIGS. 4-7 are partial cross-sectional views illustrating the region R1 of the pixel structure 100 in FIG. 1 according to some other embodiments of the present disclosure. Similarly, FIGS. 4-7 may be partial cross-sectional views taken along line A-A' of FIG. 1.

Figure 4:
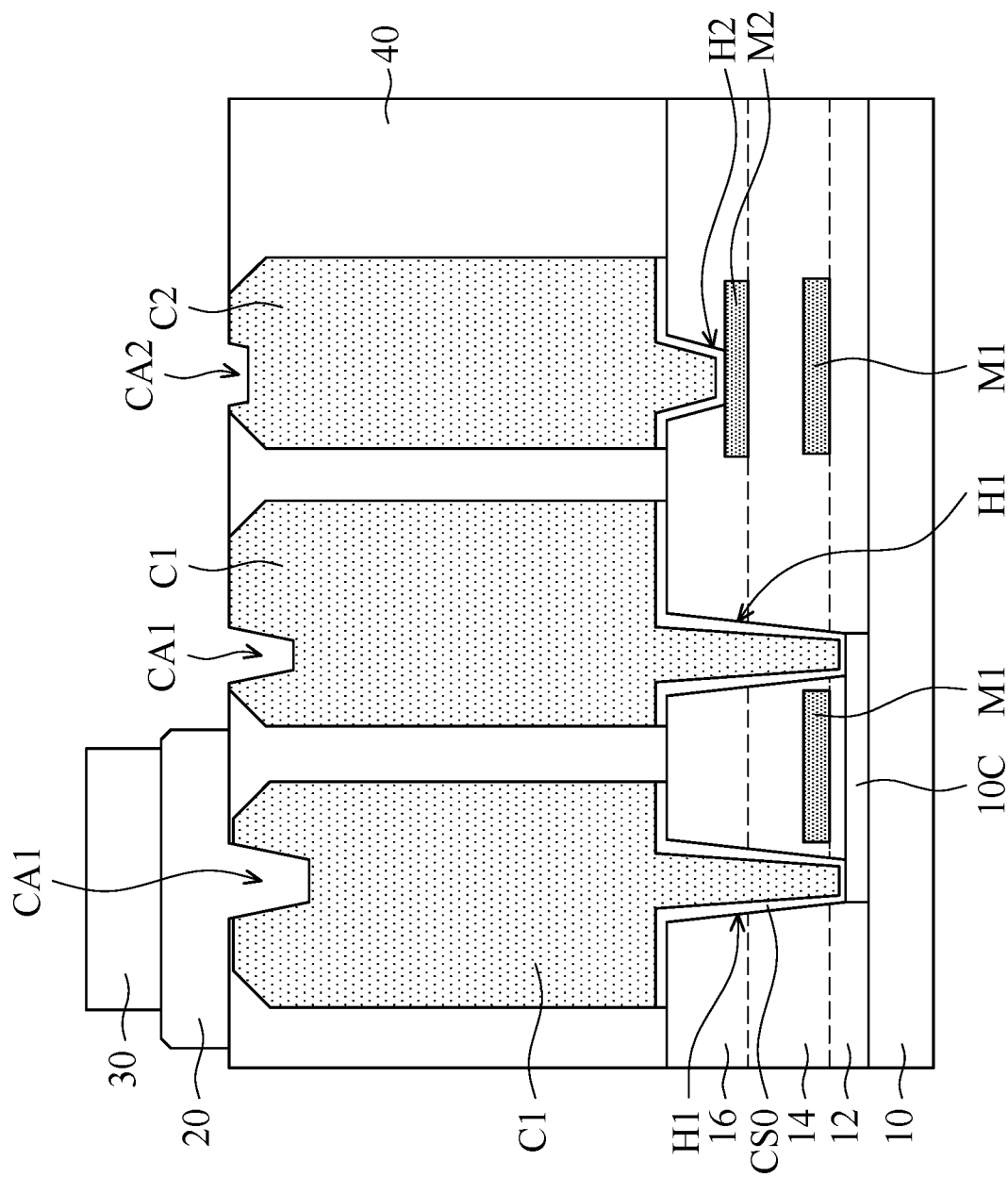
FIGS. 4-7 are partial cross-sectional views illustrating the region of the pixel structure in FIG. 1 according to some other embodiments of the present disclosure.

The cross-sectional view shown in FIG. 4 has a similar structure to the cross-sectional view shown in FIG. 2. Referring to FIG. 4, the conductive line C1 may be formed by a single process (e.g., electroplating), that is, the conductive line C1 may be directly filled into the via hole H1 without the conductive layer CS1. Similarly, the conductive line C2 may be formed by a single process (e.g., electroplating), that is, the conductive line C2 may be directly filled into the via hole H2 without the conductive layer CS2. Therefore, the conductive line C1 and the conductive line C2 may have a concave portion CA1 and a concave portion CA2 at their tops, respectively, and the concave portion CA1 and the concave portion CA2 correspond to the via hole H1 and the via hole H2, respectively. In addition, as shown in FIG. 4, in some embodiments, a portion of the electrode 20 may be disposed in the concave portion CA1 of the conductive line C1.

Figure 5:
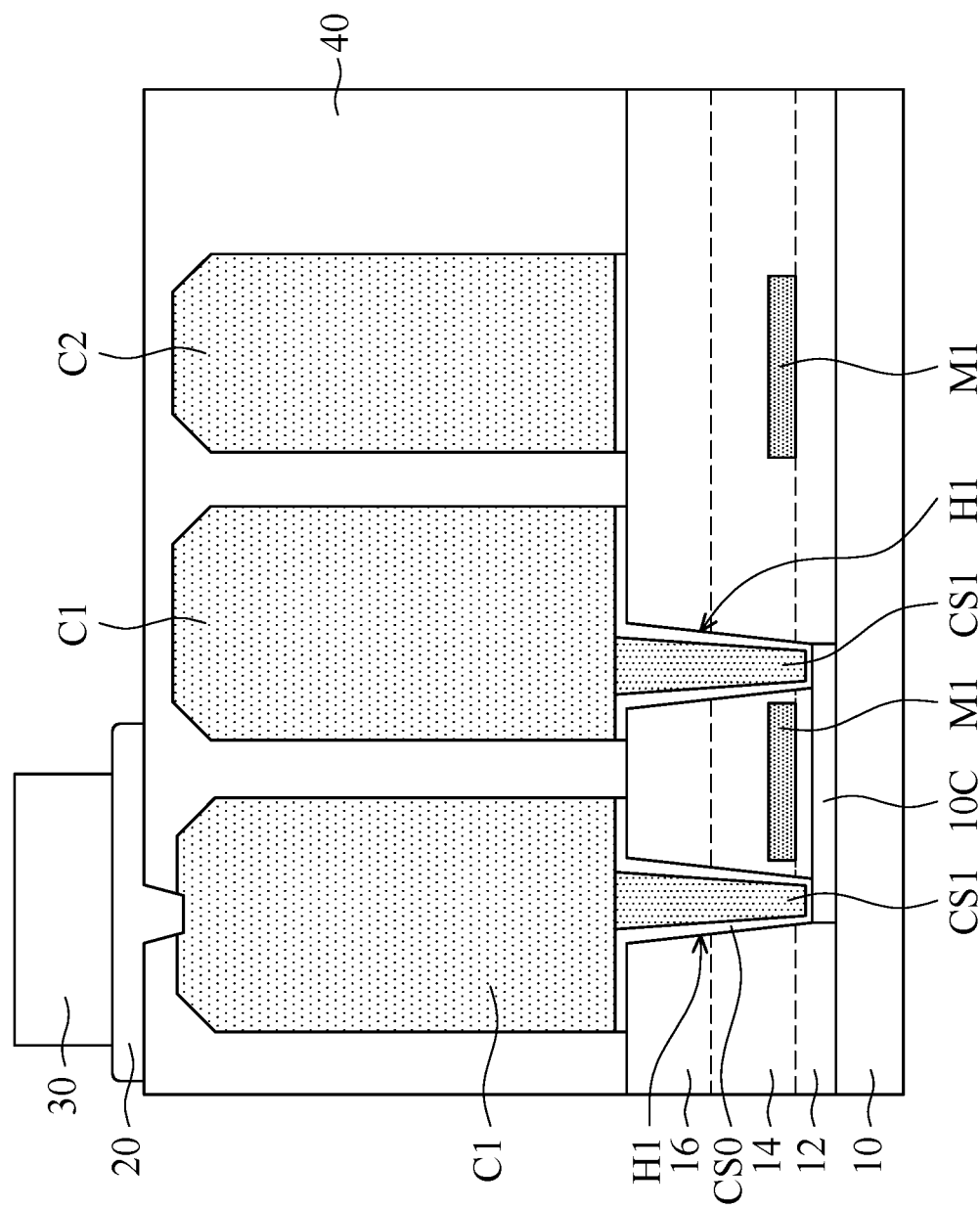

The cross-sectional view shown in FIG. 5 has a similar structure to the cross-sectional view shown in FIG. 2. Referring to FIG. 5, the pixel structure 100 may not include the second conductor layer M2. In this embodiment, the first conductor layer M1, the interlayer dielectric layers (e.g., the second interlayer dielectric layer 14 and the third interlayer dielectric layer 16), and the conductive line C2 may form a metal-insulator-metal (MIM) capacitive element.

Figure 6:
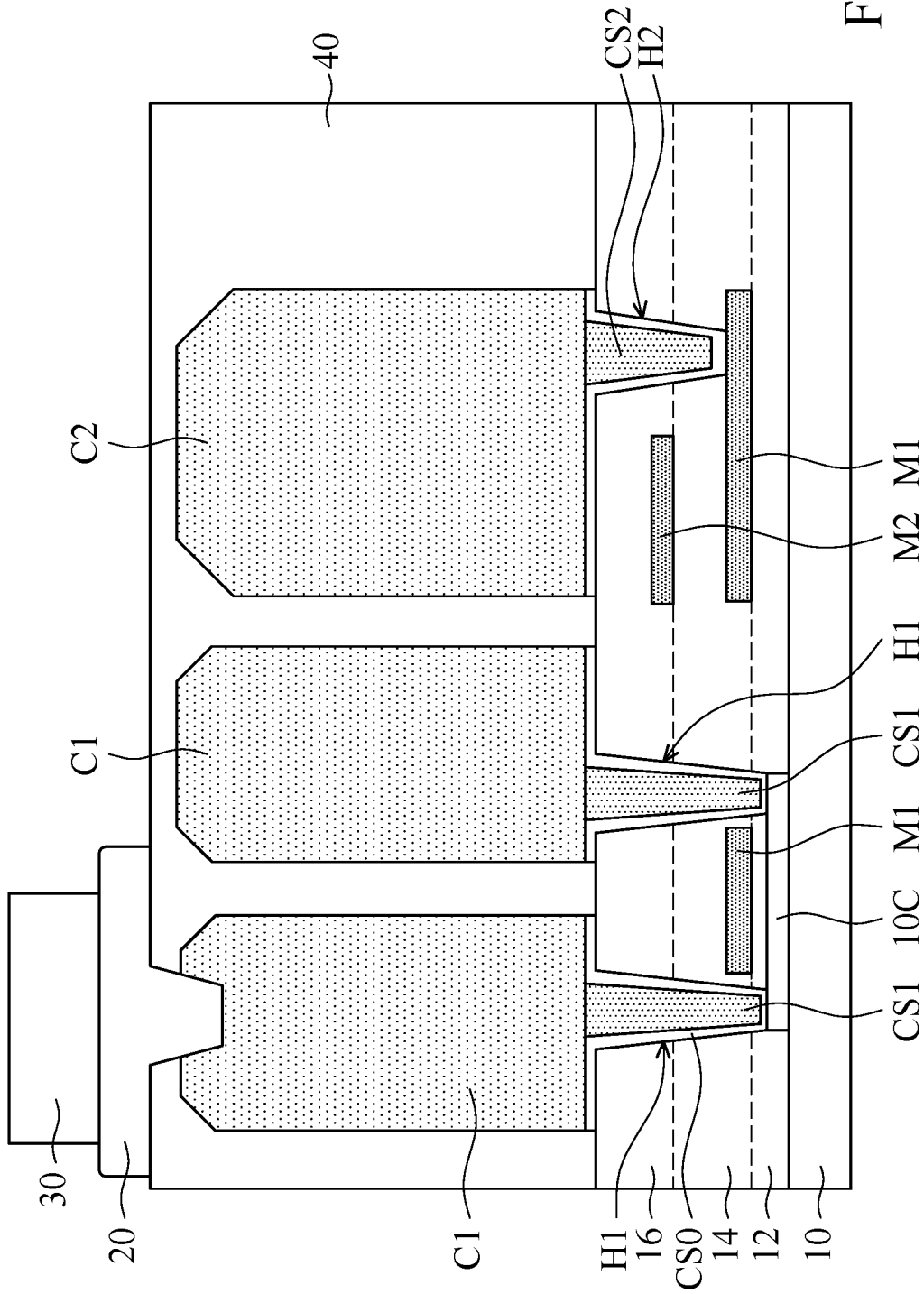

The cross-sectional view shown in FIG. 6 has a similar structure to the cross-sectional view shown in FIG. 2.

Referring to FIG. 6, the conductive line C2 is not electrically connected to the second conductor layer M2. In some embodiments, the conductive line C2 is electrically connected to the first conductor layer M1. Similarly, the conductive line C2 may be electrically connected to the first conductor layer M1 through the via hole H2 and the conductive layer CS2 filled in the via hole H2. In this embodiment, the second conductor layer M2, the interlayer dielectric layer (e.g., the third interlayer dielectric layer 16), and the conductive line C2 may form a metal-insulator-metal (MIM) capacitive element.

Figure 7:
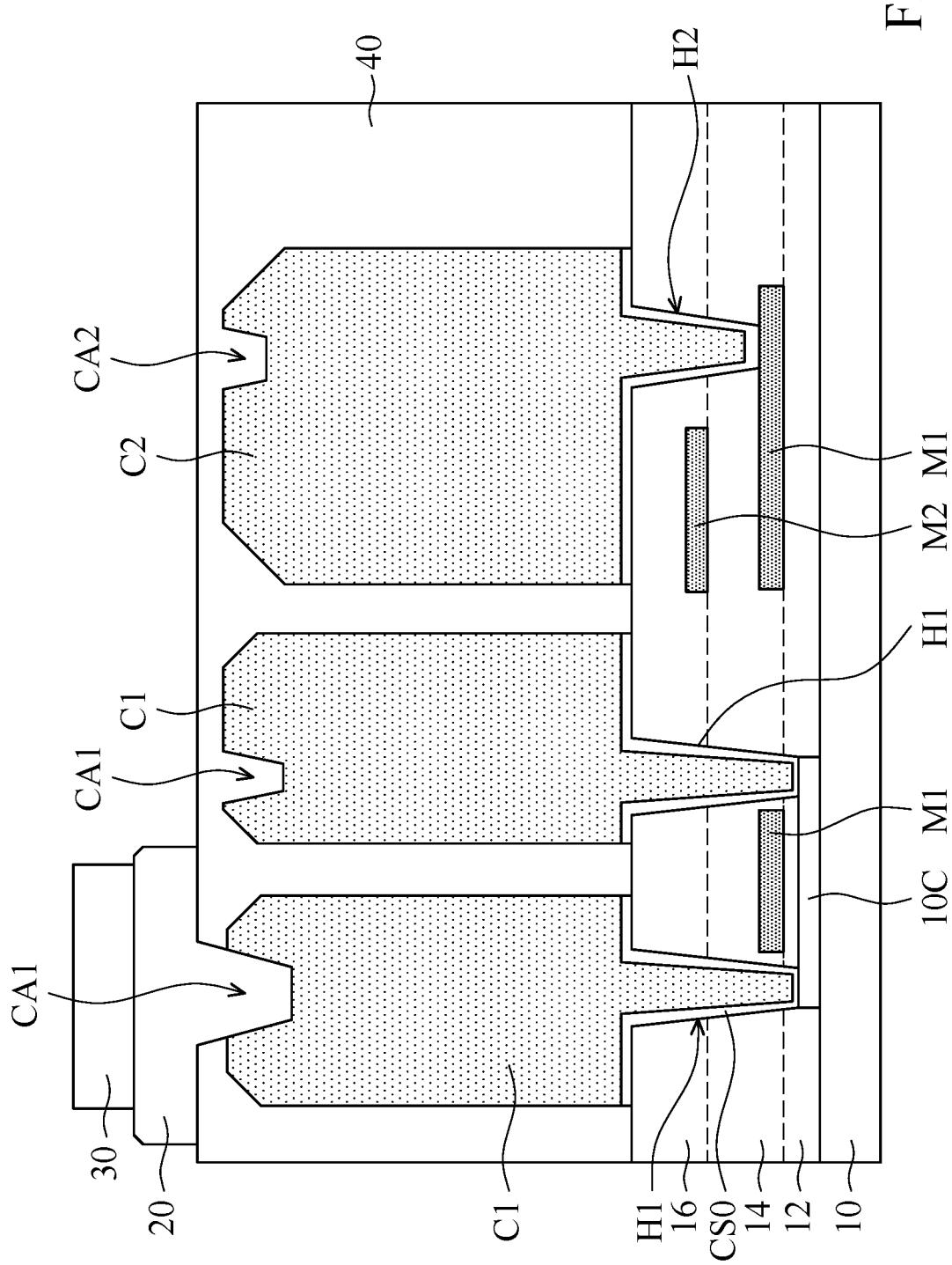

The cross-sectional view shown in FIG. 7 has a similar structure to the cross-sectional view shown in FIG. 6. Referring to FIG. 7, the conductive line C1 may be formed by a single process (e.g., electroplating), that is, the conductive line C1 may be directly filled into the via hole H1 without the conductive layer CS1. Similarly, the conductive line C2 may be formed by a single process (e.g., electroplating), that is, the conductive line C2 may be directly filled into the via hole H2 without the conductive layer CS2. Therefore, the conductive line C1 and the conductive line C2 may have a concave portion CA1 and a concave portion CA2 at their tops, respectively, and the concave portion CAL and the concave portion CA2 correspond to the via hole H1 and the via hole H2, respectively. In addition, in this embodiment, the planarization layer 40 is further disposed in the concave portion CA1 and the concave portion CA2 and on the conductive line C1 and the conductive line C2.

Figure 8:
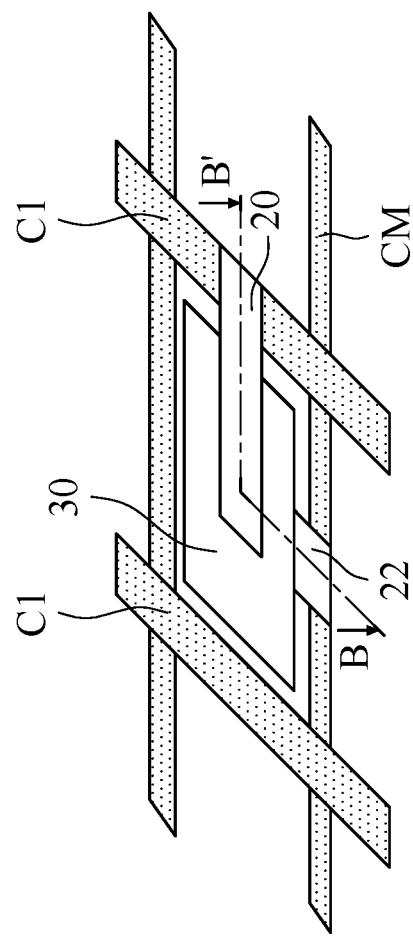
FIG. 8 is a partial schematic diagram illustrating the pixel structure according to some embodiments of the present disclosure.
Figure 9:
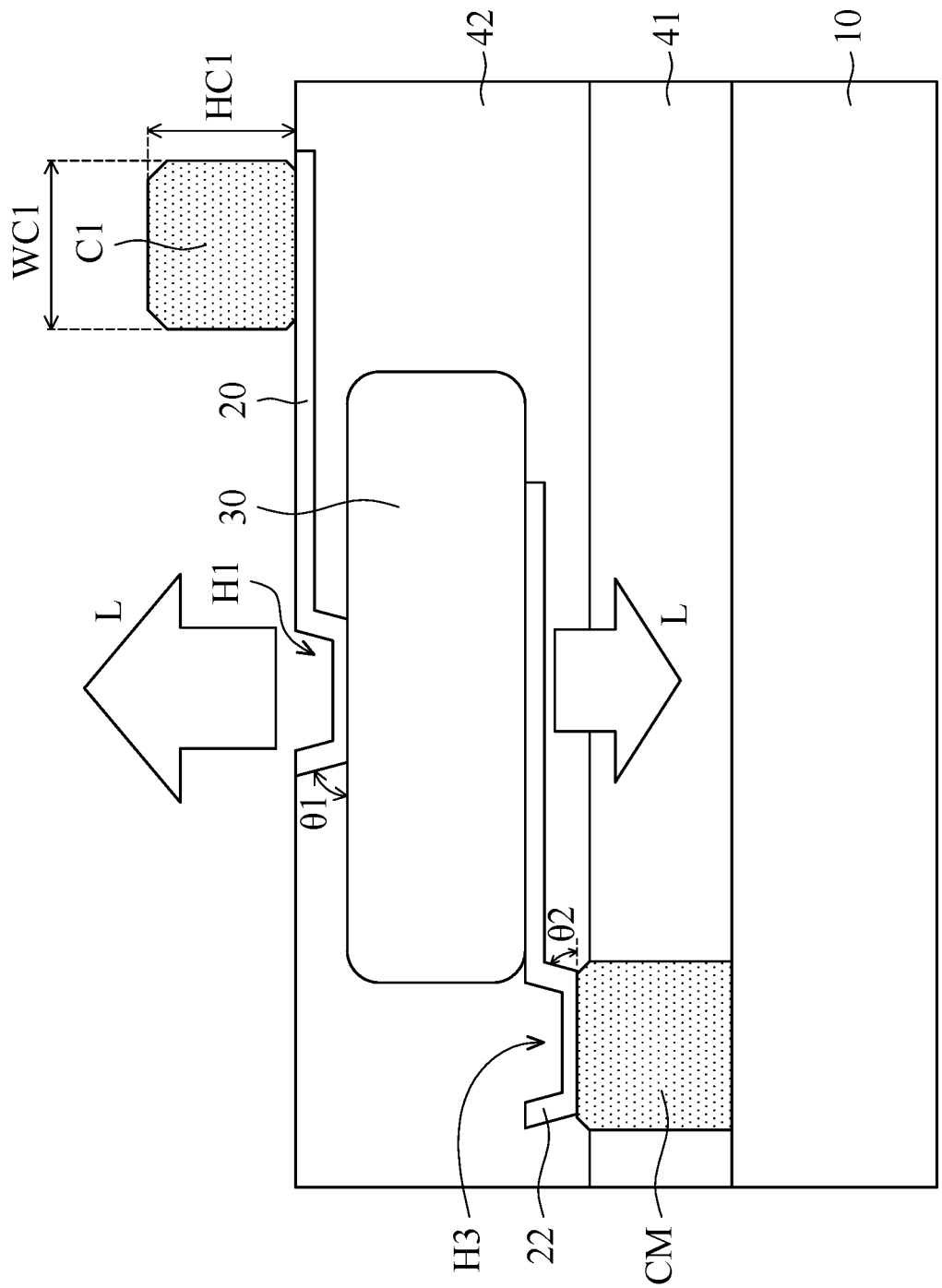
FIG. 9 is a partial cross-sectional view taken along line B-B' of FIG. 8 according to some embodiments of the present disclosure.

FIG. 8 is a partial schematic diagram illustrating the pixel structure 102 according to some embodiments of the present disclosure. FIG. 9 is a partial cross-sectional view taken along line B-B' of FIG. 8 according to some embodiments of the present disclosure. Similarly, some components of the pixel structure 102 have been omitted in FIG. 8 and FIG. 9, and the components shown in FIG. 8 and FIG. 9 may not correspond exactly.

Referring to FIG. 8 and FIG. 9, in some embodiments, the pixel structure 102 includes a substrate 10 and a conductive line C1. For example, the substrate 10 may include passive matrix circuits. That is, a plurality of pixel structures 102 may form a passive matrix display device, but the present disclosure is not limited thereto. In addition, although FIG. 9 does not show that the conductive line C1 is in direct contact with the substrate 10, the conductive line C1 may be substantially electrically connected to the substrate 10.

As shown in FIG. 9, in some embodiments, the pixel structure 102 includes an electrode 20 electrically connected to the conductive line C1. In addition, as shown in FIG. 8 and FIG. 9, in some embodiments, the pixel structure 102 may include a conversion element 30 electrically connected to the conductive line C1 through the electrode 20. Similarly, in this embodiment, the ratio of the height HC1 to the width WC1 of the conductive line C1 (i.e., HC1/WC1) may be between about 0.5 and about 6.

Moreover, as shown in FIG. 9, in some embodiments, the conductive line C1 is electrically connected to the conversion element 30 through the via hole H1 and the electrode 20 filled in the via hole H1. Specifically, the electrode 20 may be disposed at the bottom of the conductive line C1 and extend into the via hole H1 and be in contact with the conversion element 30, but the present disclosure is not limited thereto. Similarly, in this embodiment, the included angle θ1 between the via hole H1 and a plane parallel to the surface of the substrate 10 (e.g., the top surface of the conversion element 30) is between about 60 degrees and about 85 degrees.

As shown in FIG. 9, in some embodiments, the substrate 10 has a conductive metal CM, and the conversion element 30 is electrically connected to the conductive metal CM through another via hole H3 and another electrode 22 filled in the via hole H3. Similarly, in some embodiments, the included angle θ2 between the via hole H3 and a plane parallel to the surface of the substrate 10 (e.g., the top surface of the conductive metal CM) is between about 60 degrees and about 85 degrees.

For example, the conversion element 30 may be a light-emitting element of the pixel structure 102, and the electrode 20 and the electrode 22 may be selected from indium tin oxide (ITO), indium zinc oxide (IZO), or other transparent conductive films, such as conductive polymers, carbon nanotubes, graphene, metal nanowires, or other similar materials, but the present disclosure is not limited thereto. The signal connection (bridging) wire (i.e., the electrode 20) of the conductive line C1 and the conversion element 30 (e.g., the light-emitting element) and the signal connection (bridging) wire (i.e., the electrode 22) of the conductive metal CM and the conversion element 30 may be made of transparent metal, such that the pixel structure 102 may perform up-and-down-emitting display (such as the light L shown in FIG. 9), but the present disclosure is not limited thereto.

As shown in FIG. 9, in some embodiments, the pixel structure 102 may include planarization layers 41 and 42 disposed between the conductive line C1 and the substrate 10. The planarization layers 41 and 42 may include the same or similar materials as the planarization layer 40 shown in FIG. 2 and FIGS. 4-7, which will not be repeated here. As shown in FIG. 9, in some embodiments, the conversion element 30 is disposed in the planarization layer 42. In addition, the planarization layer 42 may also be filled in the via hole H3 and on the electrode 22, but the present disclosure is not limited thereto. It should be noted that although FIG. 9 shows the planarization layers 41 and 42 as two different planarization layers, the planarization layers 41 and 42 may also be the same planarization layer.

Figure 10:
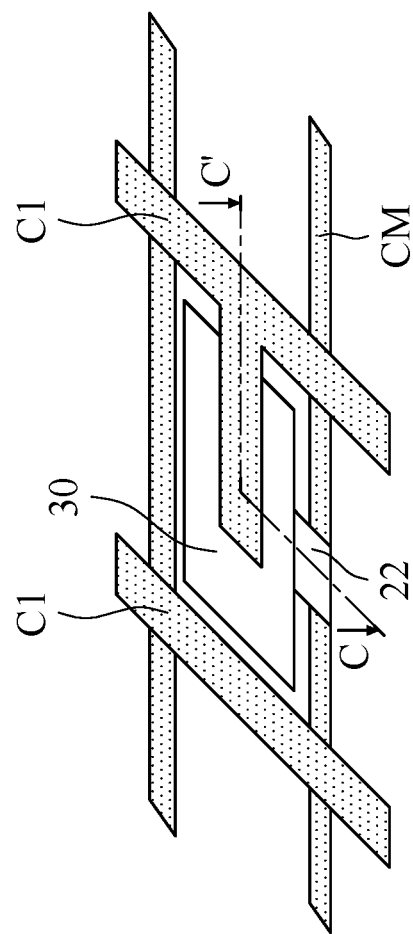
FIG. 10 is a partial schematic diagram illustrating the pixel structure according to some embodiments of the present disclosure.
Figure 11:
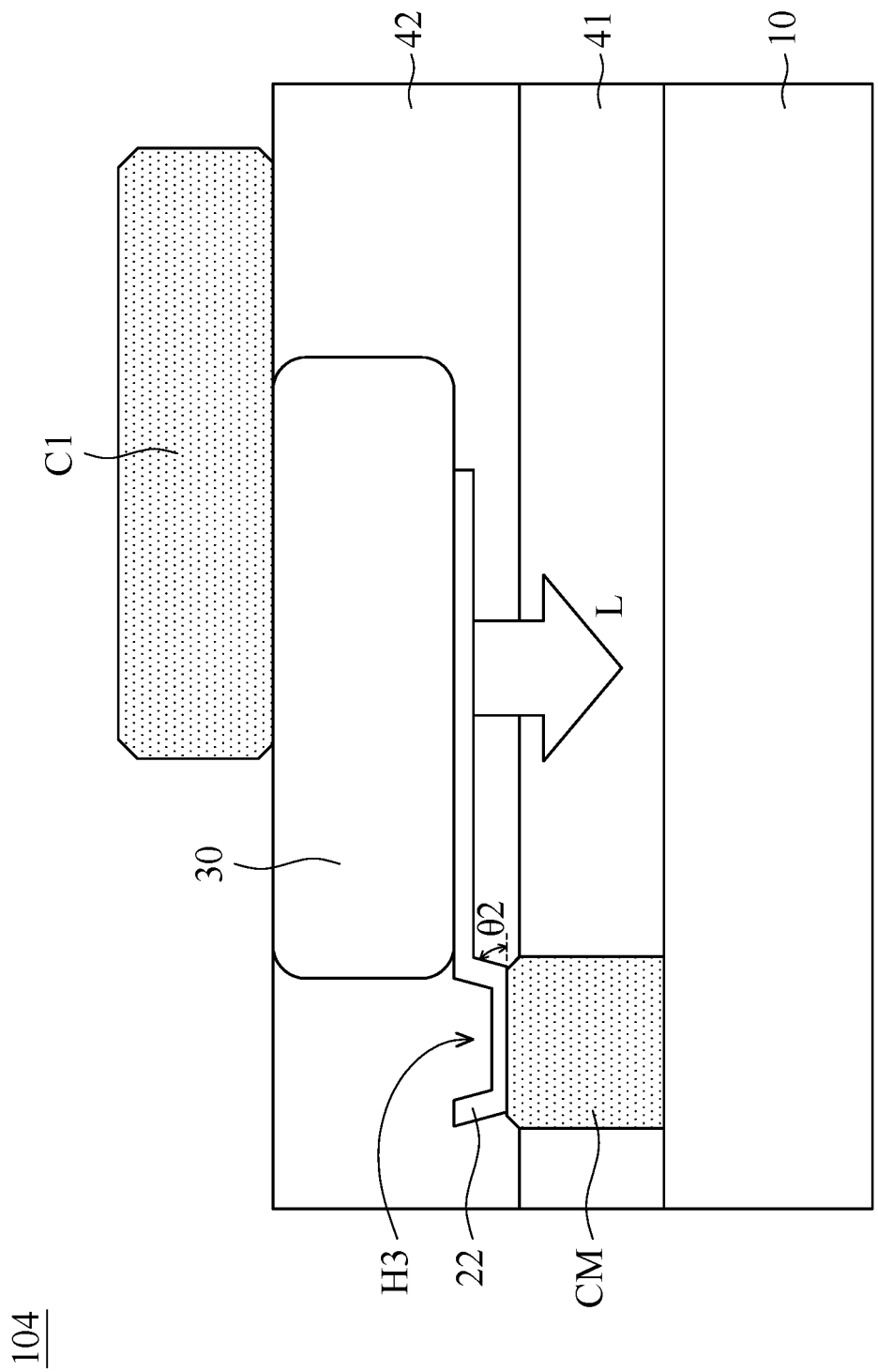
FIG. 11 is a partial cross-sectional view taken along line C-C' of FIG. 10 according to some embodiments of the present disclosure.

FIG. 10 is a partial schematic diagram illustrating the pixel structure 104 according to some embodiments of the present disclosure. FIG. 11 is a partial cross-sectional view taken along line C-C' of FIG. 10 according to some embodiments of the present disclosure. Similarly, some components of the pixel structure 104 have been omitted in FIG. 10 and FIG. 11, and the components shown in FIG. 10 and FIG. 11 may not correspond exactly.

Referring to FIG. 10 and FIG. 11, in some embodiments, the pixel structure 104 includes a substrate 10 and a conductive line C1. Similarly, the substrate 10 may include passive matrix circuits. In addition, although FIG. 11 does not show that the conductive line C1 is in direct contact with the substrate 10, the conductive line C1 may be substantially electrically connected to the substrate 10.

As shown in FIG. 11, in some embodiments, the pixel structure 104 may include a conversion element 30, and the conductive line C1 is disposed on the conversion element 30 and is in direct contact with the conversion element 30. In addition, as shown in FIG. 11, in some embodiments, the substrate 10 has a conductive metal CM, and the conversion element 30 is electrically connected to the conductive metal CM through the via hole H3 and the electrode 22 filled in the via hole H3.

Similarly, in some embodiments, the included angle θ2 between the via hole H3 and a plane parallel to the surface of the substrate 10 (e.g., the top surface of the conductive metal CM) is between about 60 degrees and about 85 degrees. Specifically, as shown in FIG. 11, the electrode 22 may extend from the bottom surface of the conversion element 30 to the via hole H3 and fill the via hole H3 to be electrically connected to the conductive metal CM. The signal connection (bridging) wire (i.e., the electrode 22) of the conductive metal CM and the conversion element 30 (e.g., the light-emitting element) may be made of transparent metal, such that the pixel structure 104 may perform down-emitting display (such as the light L shown in FIG. 11), but the present disclosure is not limited thereto.

Figure 12:
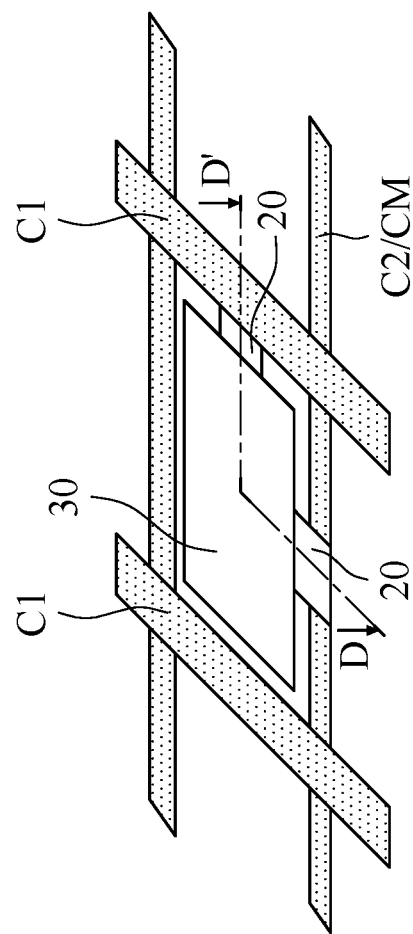
FIG. 12 is a partial schematic diagram illustrating the pixel structure according to some embodiments of the present disclosure.
Figure 13:
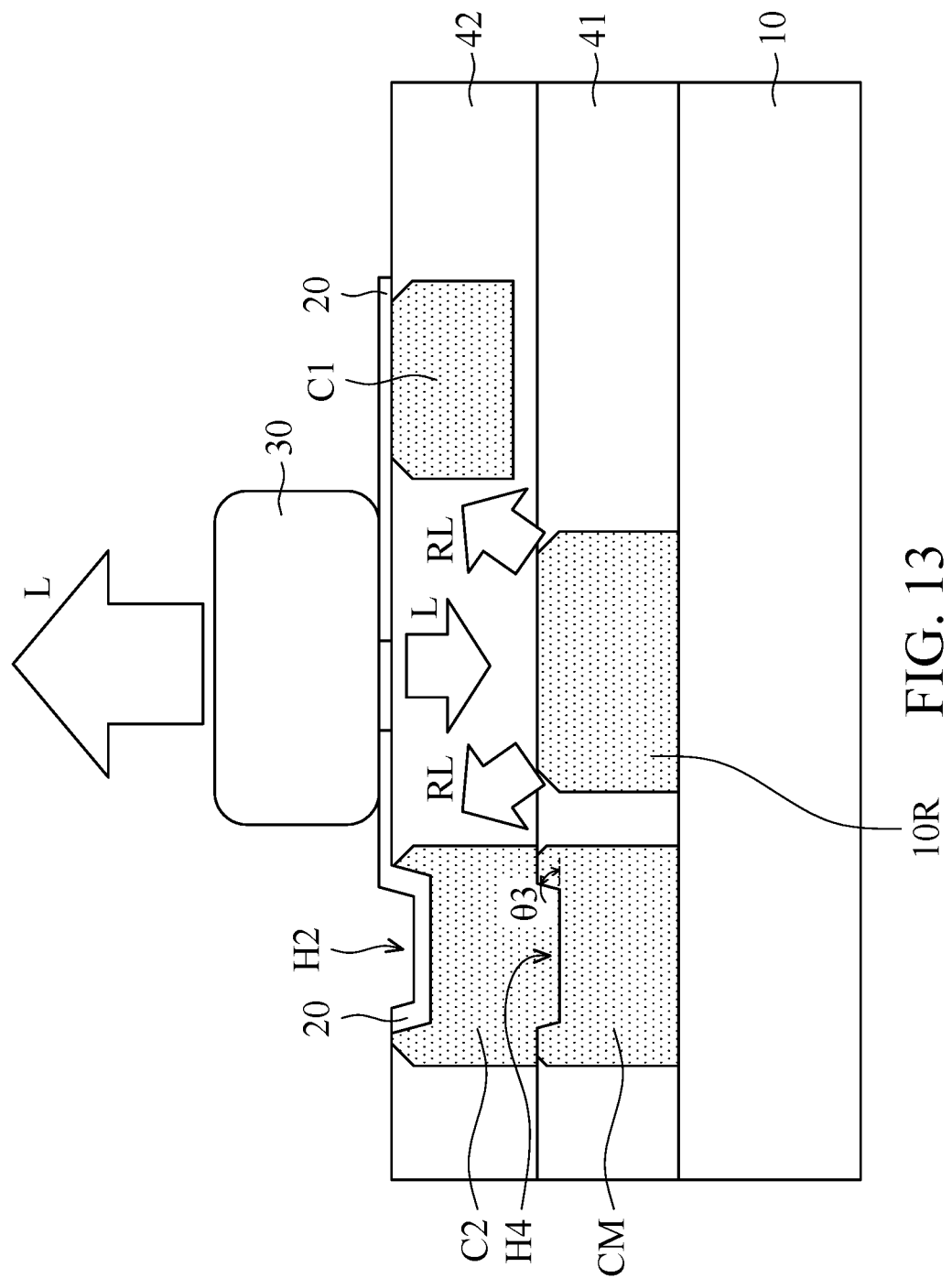
FIG. 13 is a partial cross-sectional view taken along line D-D' of FIG. 12 according to some embodiments of the present disclosure.

FIG. 12 is a partial schematic diagram illustrating the pixel structure 106 according to some embodiments of the present disclosure. FIG. 13 is a partial cross-sectional view taken along line D-D' of FIG. 12 according to some embodiments of the present disclosure. Similarly, some components of the pixel structure 106 have been omitted in FIG. 12 and FIG. 13, and the components shown in FIG. 12 and FIG. 13 may not correspond exactly.

Referring to FIG. 12 and FIG. 13, in some embodiments, the pixel structure 106 includes an electrode 20 electrically connected to the conductive lines C1 and C2. In addition, as shown in FIG. 12 and FIG. 13, in some embodiments, the pixel structure 106 may include a conversion element 30 electrically connected to the conductive lines C1 and C2 through the electrode 20. The conductive lines C1 and C2 may be disposed in the planarization layer 42, and the conversion element 30 may be disposed on the planarization layer 42. As shown in FIG. 13, in some embodiments, the conductive line C2 has a via hole H2 (e.g., the via hole H2 is on the top of the conductive line C2), and the conductive line C2 is electrically connected to the conversion element 30 through the via hole H2 and the electrode 20 filled in the via hole H2.

In addition, as shown in FIG. 13, in some embodiments, the conductive metal CM has a via hole H4, and a portion of the conductive line C2 is disposed in the via hole H4. Similarly, in some embodiments, the included angle θ3 between the via hole H4 and a plane parallel to the surface of the substrate 10 is between about 60 degrees and about 85 degrees.

As shown in FIG. 13, in some embodiments, the substrate 10 of the pixel structure 106 further includes a reflective electrode 10R, and the reflective electrode 10R may be disposed between the substrate 10 and the conversion element 30. The pixel structure 106 may perform up-and-down-emitting display (such as the light L shown in FIG. 13), and the reflective electrode 10R may further reflect the light L below the conversion element 30 (e.g., the light-emitting element) to become the reflected light RL, so as to enhance the light output from above, but the present disclosure is not limited thereto.

Figure 14:
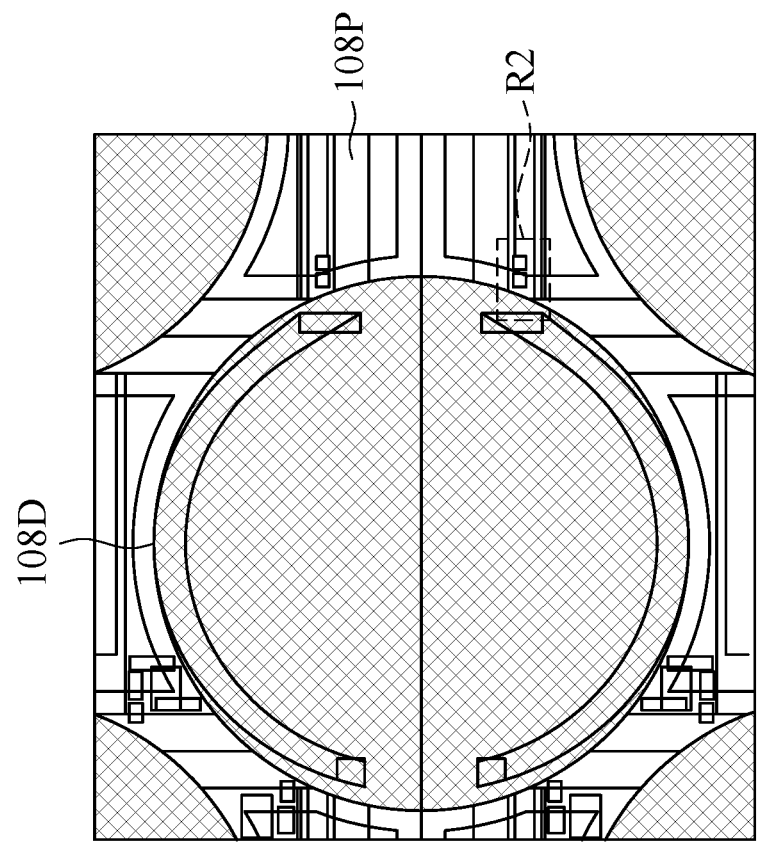
FIGS. 14-16 are partial top views illustrating the pixel structures according to some other embodiments of the present disclosure.
Figure 15:
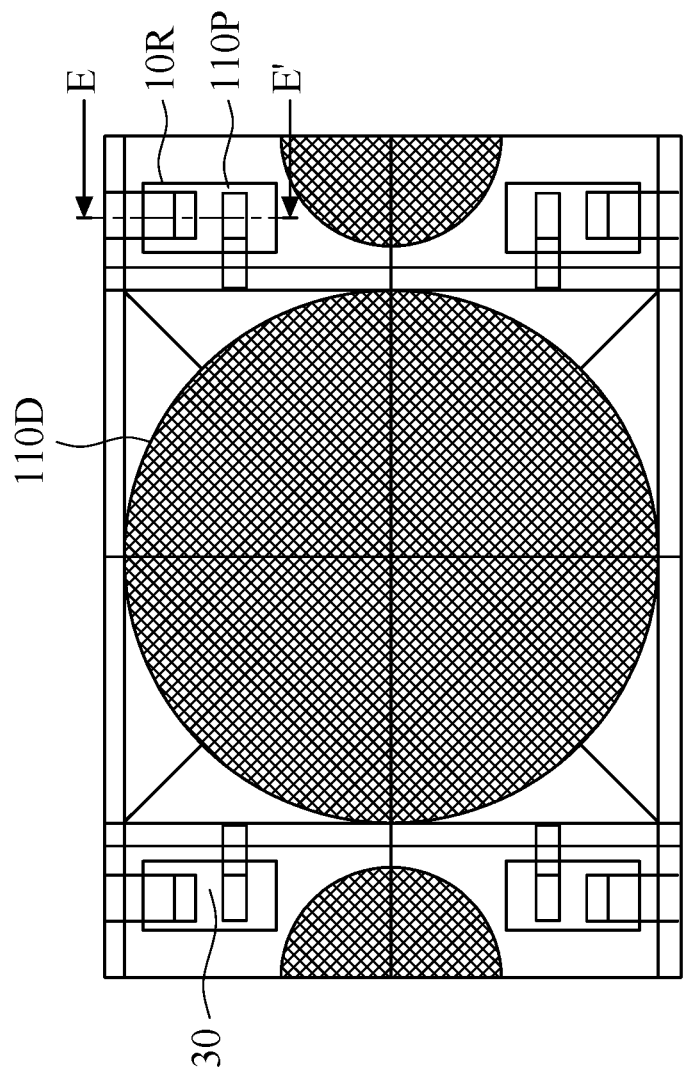
Figure 16:
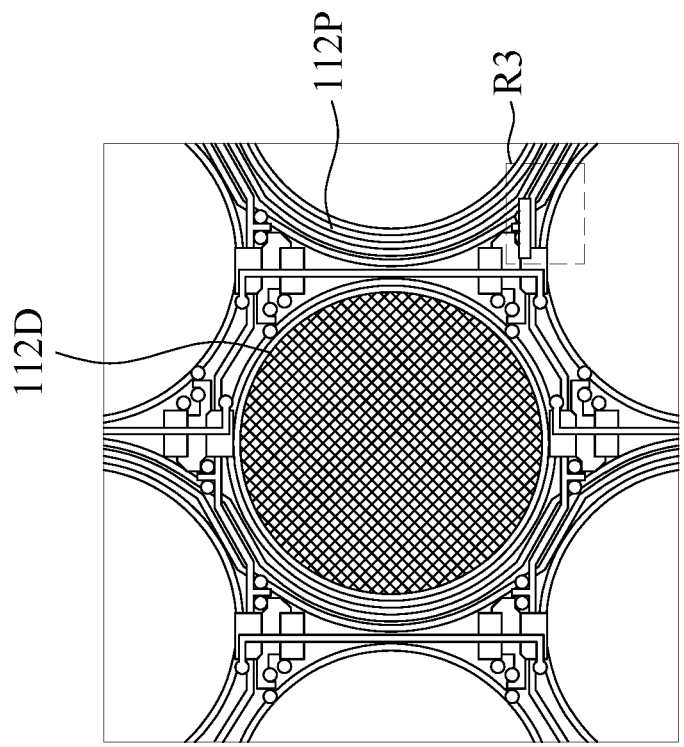

FIGS. 14-16 are partial top views illustrating the pixel structure 108, the pixel structure 110, and the pixel structure 112 according to some other embodiments of the present disclosure. Similarly, some components of the pixel structure 108, the pixel structure 110, and the pixel structure 112 have been omitted in FIGS. 14-16 for sake of brevity.

The partial cross-sectional view of the region R2 of the pixel structure 108 in FIG. 14 may be similar to the cross-sectional views shown in FIG. 2 or FIGS. 4-7. In other words, the conductive lines C1 or C2 of the pixel structure 108 may be in the peripheral region 108P of the pixel structure 108. That is, the conductive lines C1 or C2 of the pixel structure 108 may not overlap with the display region 108D of the pixel structure 108.

The partial cross-sectional view taken along line E-E' of the pixel structure 110 in FIG. 15 may be similar to the cross-sectional view shown in FIG. 9, FIG. 11, or FIG. 13. That is, in some embodiments, the orthogonal projection of the conductive line C1 or C2 of the pixel structure 110 on the substrate 10 does not overlap the orthogonal projection of the display region 110D of the pixel structure 110 on the substrate 10, but it at least partially overlaps the orthogonal projection of the peripheral region 110P of the pixel structure 110 on the substrate 10. In addition, the conversion element 30 of the pixel structure 110 may be disposed in the peripheral region 110P of the pixel structure 110.

The partial cross-sectional view of the region R3 of the pixel structure 112 in FIG. 16 may be similar to the cross-sectional views shown in FIG. 2 or FIGS. 4-7. In other words, the conductive lines C1 or C2 of the pixel structure 112 may be in the peripheral region 112P of the pixel structure 112. That is, the conductive lines C1 or C2 of the pixel structure 108 may not overlap with the display region 112D of the pixel structure 112. Moreover, in some embodiments, the conductive lines C1 and C2 may be data lines or scan lines of the pixel structure 112.

Figure 17:
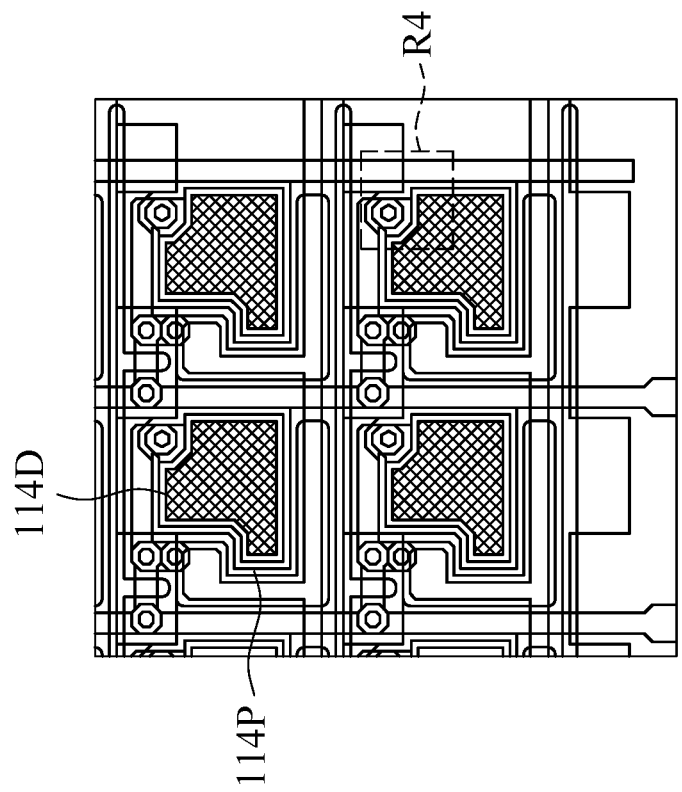
FIG. 17 is a partial top view illustrating the pixel structure according to some embodiments of the present disclosure.
Figure 18:
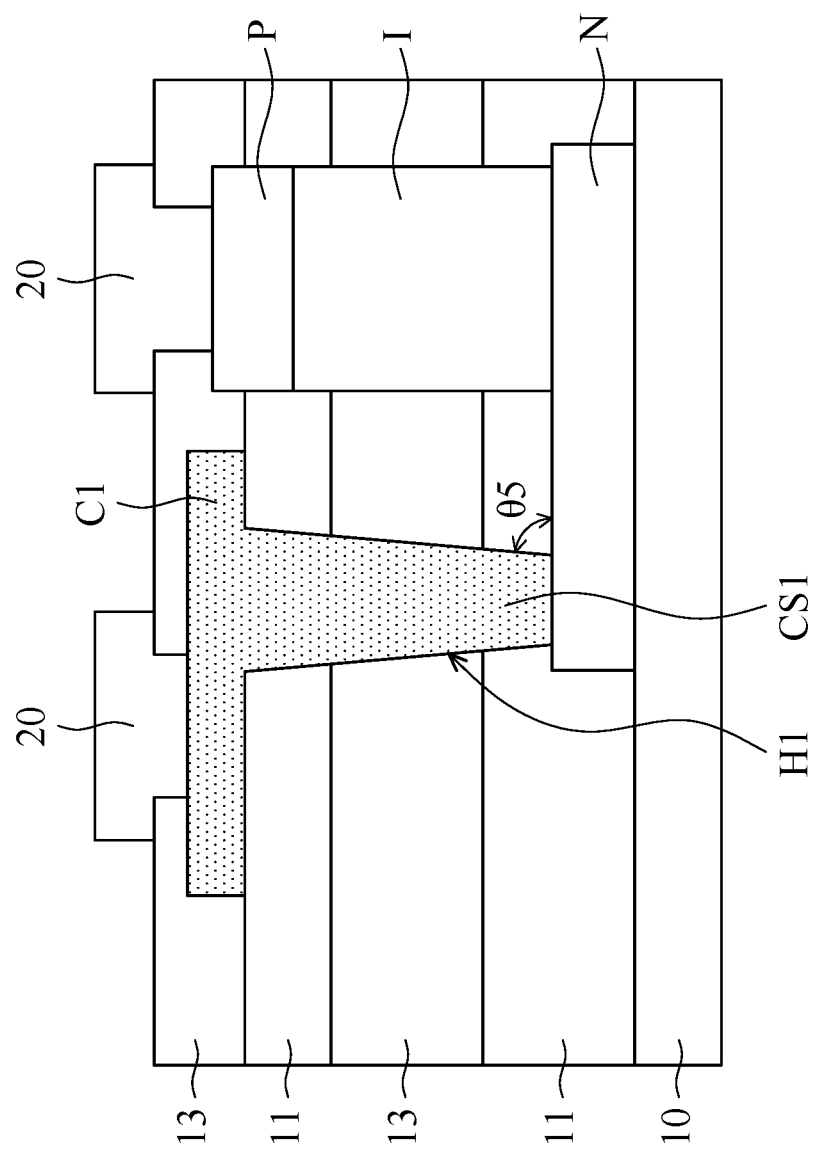
FIG. 18 is a partial cross-sectional view illustrating the region of the pixel structure in FIG. 17 according to some embodiments of the present disclosure.

FIG. 17 is a partial top view illustrating the pixel structure 114 according to some embodiments of the present disclosure. FIG. 18 is a partial cross-sectional view illustrating the region R4 of the pixel structure 114 in FIG. 17 according to some embodiments of the present disclosure. Similarly, some components of the pixel structure 114 have been omitted in FIG. 17 and FIG. 18, and the components shown in FIG. 17 and FIG. 18 may not correspond exactly.

Referring to FIG. 17, in some embodiments, the pixel structure 114 has (or is divided into) a display region 114D and a peripheral region 114P that may surround the display region 114D. For example, the display elements, the photoelectric conversion elements, the sensing contact devices, etc. of the pixel structure 114 may be disposed in the display region 114D of the pixel structure 114, and the operating elements, the sensing elements, the display elements, the conductive lines, the conductive pads, etc. of the pixel structure 114 may be disposed in the peripheral region 114P of the pixel structure 114, but the present disclosure is not limited thereto.

Referring to FIG. 17 and FIG. 18, in some embodiments, the pixel structure 114 includes a substrate 10 and a conductive line C1 electrically connected to the substrate 10. The substrate 10 may serve as a buffer layer, for example. As shown in FIG. 18, in some embodiments, the pixel structure 114 includes a plurality of alternately stacked oxide layers 11 (e.g., silicon oxide) and nitride layers 13 (e.g., silicon nitride), and the oxide layers 11 and the nitride layers 13 may be sequentially stacked on the substrate 10, for example.

As shown in FIG. 18, in some embodiments, the pixel structure 114 includes a PIN diode, and the PIN diode includes a P-type semiconductor material layer P, an amorphous silicon (a-Si) layer I, and an N-type semiconductor material layer N, and the PIN diode penetrates some oxide layers 11 and nitride layers 13 that are alternately stacked. In some embodiments, the conductive line C1 is electrically connected to the N-type semiconductor material layer N of the PIN diode through the via hole H1 and the conductive layer CS1 filled in the via hole H1. Similarly, the included angle θ5 between the via hole H1 and a plane parallel to the surface of the substrate 10 (e.g., the top surface of the N-type semiconductor material layer N) is between about 60 degrees and about 85 degrees.

As mentioned above, in the pixel structure according to the embodiment of the present disclosure, the conductive line has an aspect ratio, which may increase the design space and transparency of the pixel structure, and reduce the voltage degradation of the pixel structure. Moreover, in some embodiments, the included angle between the via hole in the corresponding region and the plane parallel to the surface of the substrate of the pixel structure is between about 60 degrees and about 85 degrees, which may effectively increase the (pixel) aperture ratio of the pixel structure, thereby improving the resolution of the display image, and manufacturing a display panel with high transparency and/or a sensing integrated structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure. Therefore, the scope of protection should be determined through the claims. In addition, although some embodiments of the present disclosure are disclosed above, they are not intended to limit the scope of the present disclosure.

Reference throughout this specification to features, advantages, or similar language does not imply that all of the features and advantages that may be realized with the present disclosure should be or are in any single embodiment of the disclosure. Rather, language referring to the features and advantages is understood to mean that a specific feature, advantage, or characteristic described in connection with an embodiment is included in at least one embodiment of the present disclosure. Thus, discussions of the features and advantages, and similar language, throughout this specification may, but do not necessarily, refer to the same embodiment.

Furthermore, the described features, advantages, and characteristics of the disclosure may be combined in any suitable manner in one or more embodiments. One skilled in the relevant art will recognize, in light of the description provided herein, that the disclosure can be practiced without one or more of the specific features or advantages of a particular embodiment. In other instances, additional features and advantages may be recognized in certain embodiments that may not be present in all embodiments of the disclosure.

What is claimed is:

1. A pixel structure, comprising
a substrate;
at least one conductive line electrically connected to the substrate, wherein a ratio of a height to a width of the at least one conductive line is between 0.5 and 6;
an electrode electrically connected to the at least one conductive line; and
a conversion element electrically connected to the at least one conductive line through the electrode,
wherein an orthogonal projection of the at least one conductive line on the substrate does not overlap an orthogonal projection of a display region on the substrate, the display region is defined as an area encompassing boundaries of a plurality of display elements of the pixel structure, the at least one conductive line is electrically connected to the substrate through a via hole and a conductive layer filled in the via hole, the at least one conductive line has a concave portion at the top, and the concave portion corresponds to the via hole.

2. The pixel structure as claimed in claim 1, wherein the width of the at least one conductive line is 2 μm.

3. The pixel structure as claimed in claim 1, wherein the ratio of the height to the width of the at least one conductive line is between 2 and 5.

4. The pixel structure as claimed in claim 1, wherein an included angle between the via hole and a plane parallel to a surface of the substrate is between 60 degrees and 85 degrees.

5. The pixel structure as claimed in claim 1, further comprising:
an interlayer dielectric layer disposed between the substrate and the at least one conductive line, wherein the via hole penetrates the interlayer dielectric layer.

6. The pixel structure as claimed in claim 5, wherein the at least one conductive line comprises two or more conductive lines, and the pixel structure further comprises:
a first conductor layer disposed in the interlayer dielectric layer and between the substrate and the conductive lines.

7. The pixel structure as claimed in claim 6, wherein one of the conductive lines is electrically connected to the first conductor layer.

8. The pixel structure as claimed in claim 6, further comprising:
a second conductor layer disposed in the interlayer dielectric layer and between the first conductor layer and the conductive lines.

9. The pixel structure as claimed in claim 8, wherein one of the conductive lines is electrically connected to the second conductor layer.

10. The pixel structure as claimed in claim 1, wherein a portion of the electrode is disposed in the concave portion.

11. The pixel structure as claimed in claim 1, further comprising:
a planarization layer disposed between the at least one conductive line and the conversion element.

12. The pixel structure as claimed in claim 1, wherein the at least one conductive line is electrically connected to the conversion element through a via hole and the electrode filled in the via hole.

13. The pixel structure as claimed in claim 12, wherein the substrate has a conductive metal, the conversion element is electrically connected to the conductive metal through another via hole and another electrode filled in the another via hole, and an included angle between the another via hole and a plane parallel to a surface of the substrate is between 60 degrees and 85 degrees.

14. The pixel structure as claimed in claim 1, wherein the substrate has a conductive metal, the conductive metal has a via hole, a portion of the at least one conductive line is disposed in the via hole, and an included angle between the via hole and a plane parallel to a surface of the substrate is between 60 degrees and 85 degrees.

15. The pixel structure as claimed in claim 1, wherein the conversion element is a light-emitting element, and the substrate further comprises a reflective electrode disposed between the substrate and the conversion element.

16. The pixel structure as claimed in claim 1, wherein the at least one conductive line is a data line or a scan line of the pixel structure.

17. The pixel structure as claimed in claim 1, wherein the at least one conductive line is electrically connected to an N-type semiconductor material layer of a PIN diode through a via hole and a conductive layer filled in the via hole, and an included angle between the via hole and a plane parallel to a surface of the substrate is between 60 degrees and 85 degrees.

\* \* \* \* \*